United States Patent [19]
Horsky

[11] Patent Number: 6,107,634
[45] Date of Patent: Aug. 22, 2000

[54] DECABORANE VAPORIZER

[75] Inventor: Thomas N. Horsky, Boxborough, Mass.

[73] Assignee: Eaton Corporation, Cleveland, Ohio

[21] Appl. No.: 09/070,685

[22] Filed: Apr. 30, 1998

[51] Int. Cl.[7] .......................... H01J 37/08; H01J 37/317
[52] U.S. Cl. ................... 250/423 R; 250/424; 250/425; 250/429; 250/492.21
[58] Field of Search ................... 250/423 R, 492.21, 250/429, 424, 425

[56] References Cited

U.S. PATENT DOCUMENTS

| | | | |
|---|---|---|---|
| 4,926,021 | 5/1990 | Streusand et al. | 219/121.59 |
| 5,661,308 | 8/1997 | Benveniste et al. | 250/492.21 |
| 5,872,359 | 1/1999 | Stewart et al. | 250/339.12 |
| 5,977,552 | 11/1999 | Foad | 250/492.21 |

*Primary Examiner*—Bruce C. Anderson
*Assistant Examiner*—Nikita Wells
*Attorney, Agent, or Firm*—John A. Kastelic

[57] ABSTRACT

An ion source (50) for an ion implanter is provided, comprising: (i) a sublimator (52) having a cavity (66) for receiving a source material (68) to be sublimated and for sublimating the source material; (ii) an ionization chamber (58) for ionizing the sublimated source material, the ionization chamber located remotely from the sublimator; (iii) a feed tube (62) for connecting the sublimator (52) to the ionization chamber (58); and (iv) a heating medium (70) for heating at least a portion of the sublimator (52) and the feed tube (62). A control mechanism is provided for controlling the temperature of the heating medium (70). The control mechanism comprises a heating element (80) for heating the heating medium (70), a pump (55) for circulating the heating medium, at least one thermocouple (92) for providing temperature feedback from the heating medium (70), and a controller (56) responsive to the temperature feedback to output a first control signal (94) to the heating element.

19 Claims, 3 Drawing Sheets

DECABORANE VAPORIZER

RELATED APPLICATION

U.S. patent application Ser. No. 09/416,159, filed Oct. 11, 1999, entitled Decaborane Ion Source.

FIELD OF THE INVENTION

The present invention relates generally to ion sources for ion implantation equipment and more specifically to a decaborane vaporizer for an ion source.

BACKGROUND OF THE INVENTION

Ion implantation has become a standard accepted technology of industry to dope workpieces such as silicon wafers or glass substrates with impurities in the large scale manufacture of items such as integrated circuits and flat panel displays. Conventional ion implantation systems include an ion source that ionizes a desired dopant element which is then accelerated to form an ion beam of prescribed energy. The ion beam is directed at the surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high vacuum process chamber which prevents dispersion of the ion beam by collisions with residual gas molecules and which minimizes the risk of contamination of the workpiece by airborne particulates.

Ion dose and energy are the two most important variables used to define an implant step. Ion dose relates to the concentration of implanted ions for a given semiconductor material. Typically, high current implanters (generally greater than 10 milliamps (mA) ion beam current are used for high dose implants, while medium current implanters (generally capable up to about 1 mA beam current) are used for lower dose applications. Ion energy is used to control junction depth in semiconductor devices. The energy levels of the ions which make up the ion beam determine the degree of depth of the implanted ions. High energy processes such as those used to form retrograde wells in semiconductor devices require implants of up to a few million electron volts (MeV), while shallow junctions may only demand energies below 1 thousand electron volts (KeV).

The continuing trend to smaller and smaller semiconductor devices requires implanters with ion sources that serve to deliver high beam currents at low energies. The high beam current provides the necessary dosage levels, while the low energy levels permit shallow implants. Source/drain junctions in complementary metal-oxide-semiconductor (CMOS) devices, for example, require such a high current, low energy application.

A typical ion source 10 for obtaining atoms for ionization from a solid form is shown in FIG. 1. The ion source comprises a pair of vaporizers 12 and 14 and an ionization chamber 16. Each of the vaporizers is provided with a crucible 18 in which a solid element or compound is placed and which is heated by a heater coil 20 to vaporize the solid source material. Heater coil leads 22 conduct electrical current to the heater coils and thermocouples 24 provide a temperature feedback mechanism. Air cooling conduit 26 and water-cooling conduit 28 is also provided.

Vaporized source material passes through a nozzle 30, which is secured to the crucible 18 by a graphite nozzle retainer 32, and through vaporizer inlets 34 to the interior of the ionization chamber 16. Alternatively, compressed gas may be fed directly into the ionization chamber by means of a gas inlet 36 via a gas line 38. In either case, the gaseous/vaporized source material is ionized by an arc chamber filament 40 that is heated to thermionically emit electrons.

Conventional ion sources utilize an ionizable dopant gas which is obtained either directly from a source of a compressed gas or indirectly from a solid from which has been vaporized. Typical source elements are boron (B), phosphorous (P), gallium (Ga), indium (In), antimony (Sb), and arsenic (As). Most of these source elements are provided in solid form, except boron, which is typically provided in gaseous form, e.g., as boron trifluoride ($BF_3$).

In the case of implanting boron trifluoride, a plasma is created which includes singly charged boron (B+) ions. Creating and implanting a sufficiently high dose of boron into a substrate is usually not problematic if the energy level of the beam is not a factor. In low energy applications, however, the beam of boron ions will suffer from a condition known as "beam blow-up", which refers to the tendency for like-charged ions within the ion beam to mutually repel each other. Such mutual repulsion causes the ion beam to expand in diameter during transport, resulting in vignetting of the beam by multiple apertures in the beamline. This severely reduces beam transmission as beam energy is reduced.

Decaborane ($B_{10}H_{14}$) is a compound which has not heretofore been used as a source of boron for boron implants. The vaporization of decaborane cannot be suitably controlled in the crucible of the ion source of FIG. 1 because decaborane in the solid state has a melting point of about 100° C. Heat generated within the arc chamber 16 will cause the crucible to achieve such a temperature even if the vaporizer heaters are not energized, because the proximity of the solid phase material to the arc chamber results in radiative heating of the material. (The vaporization of phosphorous, on the other hand, can be accurately controlled in the crucible of the ion source of FIG. 1 because it has a melting point of about 400° C.) This prevents the establishment of a moderate temperature (less than 200° C.) thermal equilibrium within the local environment of the source material.

Decaborane, however, is an excellent source of feed material for boron implants because each decaborane molecule ($B_{10}H_{14}$) when vaporized and ionized can provide a molecular ion comprised of ten boron atoms. Such a source is especially suitable for high dose/low energy implant processes used to create shallow junctions, because a molecular decaborane ion beam can implant ten times the boron dose per unit of current as can a monotomic boron ion beam. In addition, because the decaborane molecule breaks up into individual boron atoms of roughly one-tenth the original beam energy at the workpiece surface, the beam can be transported at ten times the energy of a dose-equivalent monotomic boron ion beam. This feature enables the molecular ion beam to avoid the transmission losses which are typically brought about by low energy ion beam transport.

Accordingly, it is an object of the present invention to provide an ion source for an ion implanter which can accurately and controllably vaporize decaborane, or other suitable implant material, to overcome the deficiencies of known ion sources.

SUMMARY OF THE INVENTION

An ion source for an ion implanter is provided, comprising: (i) a sublimator having a cavity for receiving a source material to be sublimated and for sublimating the source material; (ii) an ionization chamber for ionizing the sublimated source material, the ionization chamber located remotely from the sublimator; (iii) a feed tube for connecting the sublimator to the ionization chamber; and (iv) a heating medium for heating at least a portion of the sublimator and the feed tube. A control mechanism is provided for controlling the temperature of the heating medium. The control mechanism comprises a heating element for heating the heating medium, a pump for circulating the heating medium, at least one thermocouple for providing temperature feedback from the heating medium, and a controller responsive to the temperature feedback to output a control signal to the heating element.

Because the sublimator is located remotely from the ionization chamber, the temperature within the sublimator is thermally isolated, providing a thermally stable environment unaffected by the temperature in the ionization chamber. In this manner, the temperature of the sublimator, in which the process of decaborane sublimation occurs, may be controlled independently of the operating temperature of the ionization chamber to a high degree of accuracy (within 1° C.).

DETAILED DESCRIPTION OF A PREFERRED EMBODIMENT OF THE INVENTION

Figure 1:
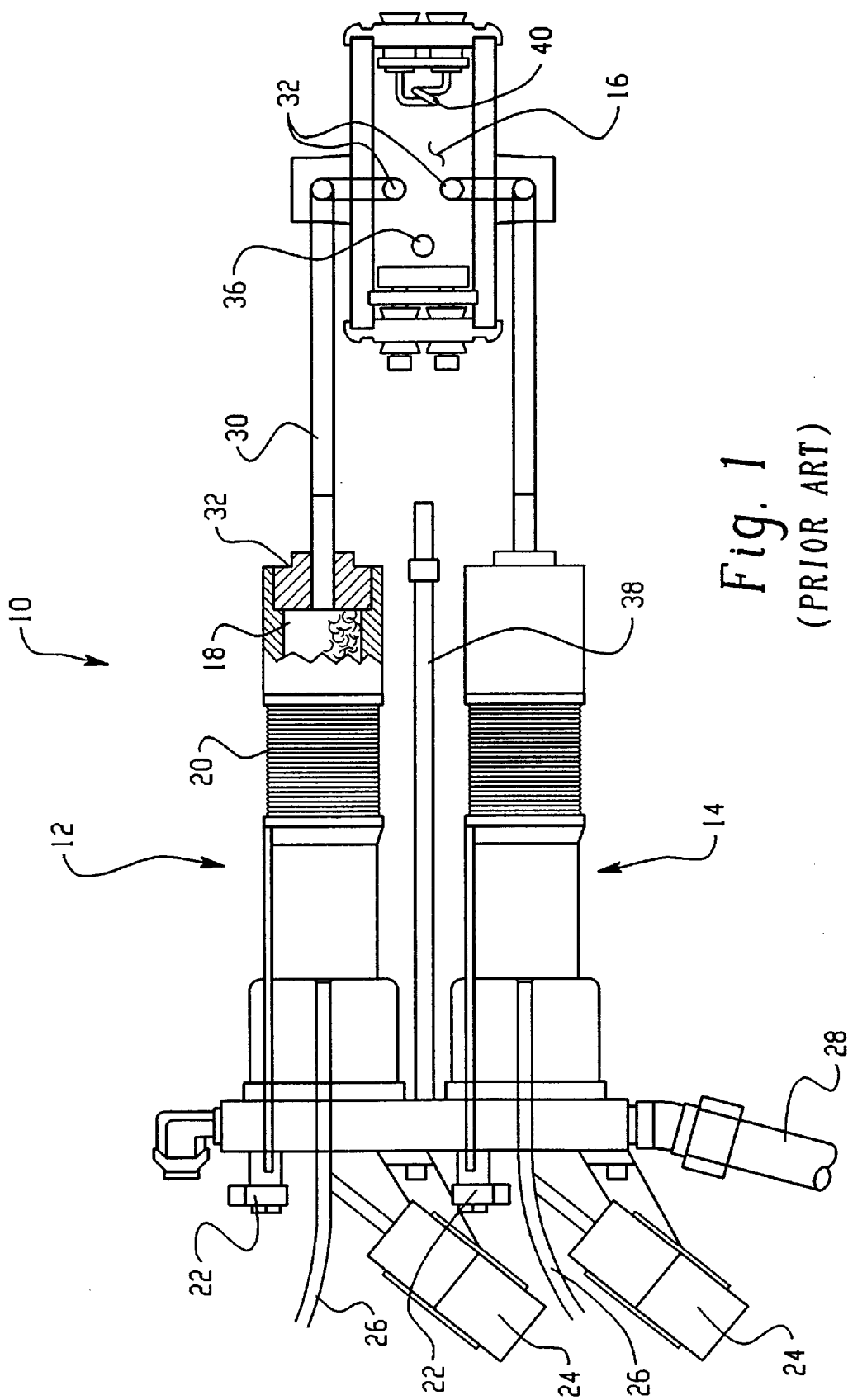
FIG. 1 is a perspective, partially cross sectional view of a conventional ion source for an ion implanter.
Figure 2:
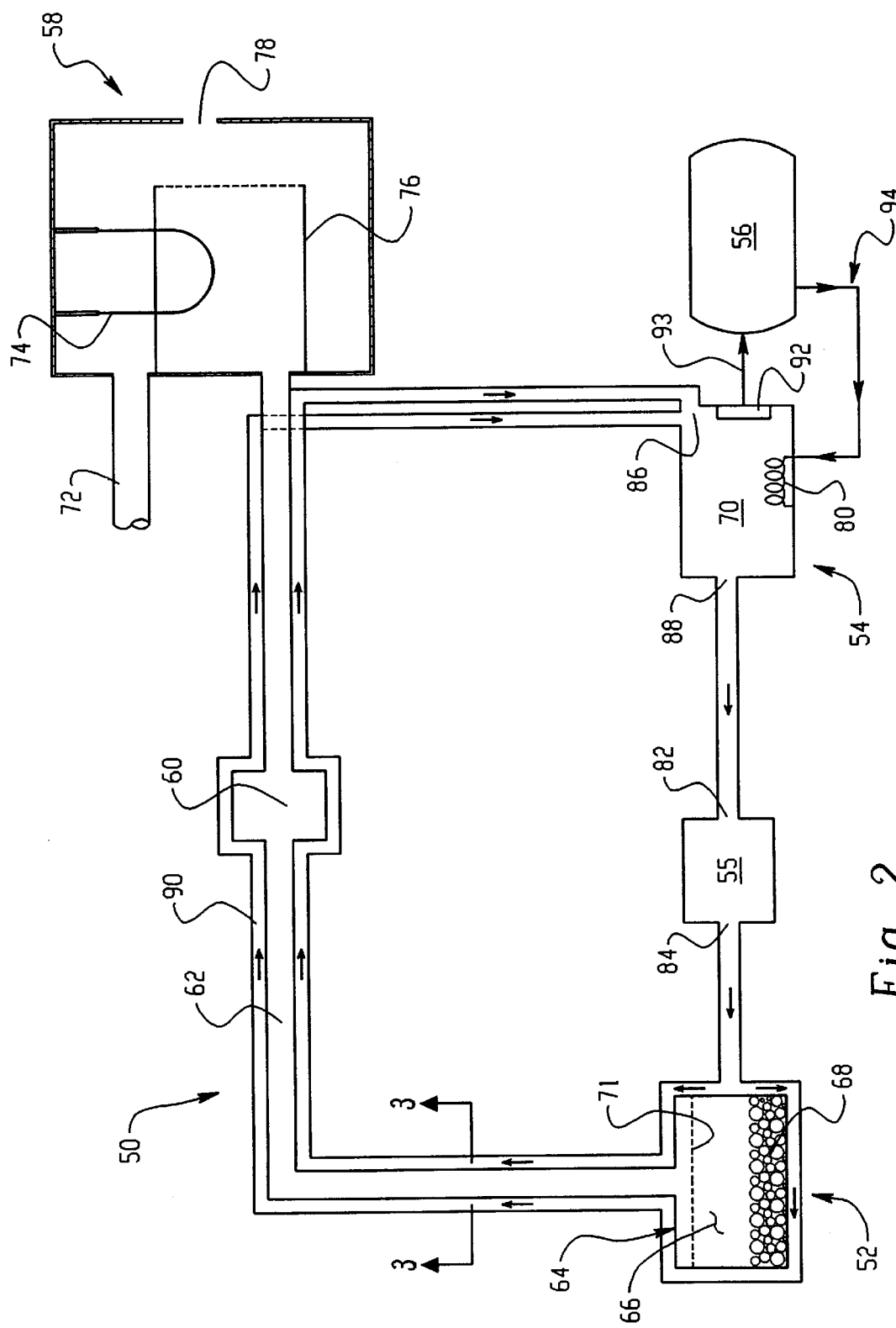
FIG. 2 is a schematic, partially cross sectional view of a first embodiment of an ion source for an ion implanter constructed according to the principles of the present invention.

Referring now to FIG. 2 of the drawings, a first embodiment of an ion implanter ion source 50 which has been constructed according to the present invention is shown. The ion source 50 comprises a non-reactive, thermally conductive sublimator or crucible 52, a heating medium reservoir 54, a heating medium pump 55, a temperature controller 56, an ionization chamber 58, and (in this first embodiment) a mass flow controller 60. The crucible 52 is located remotely from the ionization chamber 58 and connected thereto by a feed tube 62, constructed of quartz or stainless steel. In this first embodiment, the feed tube 62 is surrounded by an outer single-chamber annular sheath 90 along substantially the entire length thereof.

The crucible 52 provides a container 64 enclosing a cavity 66 for containing a source material 68. The container is preferably made of a suitable non-reactive (inert) material such as stainless steel, graphite, quartz or boron nitride and which is capable of holding a sufficient amount of source material such as decaborane ($B_{10}H_{14}$). Although the invention is described further below only in terms of decaborane, it is contemplated that the principles of the present invention may be used for other molecular solid source materials, such as indium chloride (InCl), which are characterized as having both low melting points (i.e. sublimation temperatures of between 20° C. and 150° C.) and significant vapor pressures (i.e. between $10^{-2}$ Torr and $10^{3}$ Torr).

The decaborane is vaporized through a process of sublimation by heating the walls of the container 64 with a heating medium 70 contained in reservoir 54. The process of sublimation comprises the transformation of the decaborane from a solid state to a vapor state without entering an intermediate liquid state. A wire mesh 71 prevents non-vaporized decaborane from escaping the crucible 52. Completely vaporized decaborane exits the crucible 52 via feed tube 62 and enters mass flow controller 60, which controls the flow of vapor, and thus meters the amount of vaporized decaborane which is provided to the ionization chamber, as is known in the art.

The ionization chamber 58 ionizes the vaporized decaborane that is provided by the mass flow controller 60 or, alternatively, a gas inlet feed 72 from a compressed gas source. An RF exciter 74 such as an antenna is energized to emit an RF signal which ionizes the vaporized decaborane molecules to create a plasma. A magnetic filter 76 filters the plasma, and extractor electrodes (not shown) located outside an exit aperture 78 of the ionization chamber 58 extract the plasma through the aperture as is known in the art. This extracted plasma forms an ion beam that is conditioned and directed toward a target workpiece. An example of such an ionization chamber 58 is shown in U.S. Pat. No. 5,661,308, assigned to the assignee of the present invention and incorporated by reference as if fully set forth herein.

The inventive ion source 50 provides a control mechanism for controlling the operating temperature of the crucible 52, as well as that of the feed tube 62 through which vaporized decaborane passes on its way to the ionization chamber 58. The heating medium 70 is heated within the reservoir 54 by a resistive or similar heating element 80. The temperature control means comprises a temperature controller 56 which obtains as an input temperature feedback from the reservoir 54 via thermocouple 92, and outputs a control signal to heating element 80, as further described below, so that the heating medium 70 in the reservoir is heated to a suitable temperature.

The heating medium 70 comprises mineral oil or other suitable medium (e.g. water) that provides a high heat capacity. The oil is heated to a temperature within the 20° C. to 150° C. range by the heating element 80 and circulated by pump 55 around the crucible 52 and the feed tube 62 through sheath 90. The pump 55 is provided with an inlet and an outlet 82 and 84, respectively, and the reservoir 54 is similarly provided with an inlet 86 and an outlet 88, respectively. The flow pattern of the heating medium about the crucible 52 and the feed tube 62, although shown in a unidirectional clockwise pattern in FIG. 2, may be any pattern that provides reasonable circulation of the medium about the crucible 52 and the feed tube 62.

Figure 3:
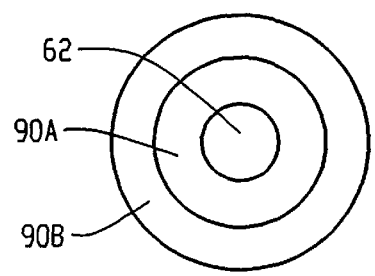
FIG. 3 is a cross sectional view of a connecting tube of an alternative embodiment of the ion source of FIG. 2, taken along the lines 3—3.

Alternatively, in a second embodiment of the invention, the feed tube 62 is provided in the form of a capillary tube and sheath 90 is provided in the form of a coaxial dual-chamber sheath, comprising an inner sheath 90A surrounded by an outer sheath 90B (see FIG. 3). The heating medium may be pumped into the inner sheath 90A (located adjacent the capillary tube 62) and pumped out of the outer sheath 90B (located radially outward from the inner sheath 90A). In this second embodiment, the mass flow controller 60 is replaced with a heated shut-off valve (not shown) located at the feed tube/ionization chamber interface, and mass flow is increased or decreased by directly changing the temperature of the reservoir 54. The arrangement of the coaxial sheath surrounding the capillary tube has the advantage of providing an insulating sheath surrounding the inner diameter of the capillary tube, thereby resulting in a more uniform temperature.

Referring back to FIG. 2, the crucible cavity 66 is pressurized in order to facilitate material transfer of the vaporized (sublimated) decaborane from the crucible 52 to the ionization chamber 58 through the feed tube 62. As the pressure within cavity 66 is raised, the rate of material transfer correspondingly increases. The ionization chamber operates at a near vacuum (about 1 millitorr), and thus, a pressure gradient exists along the entire length of the feed tube 62, from the crucible 52 to the ionization chamber 58. The pressure of the crucible is typically on the order of 1 torr.

Figure 4A:
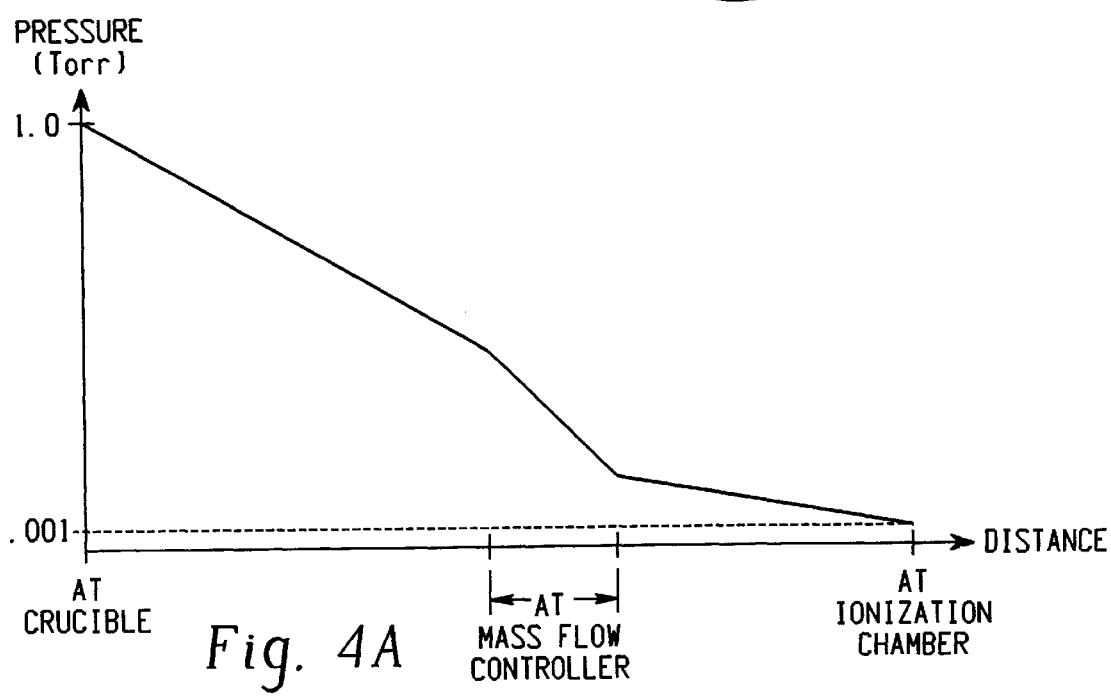
FIG. 4A is a graphical representation of the pressure gradient that exists along the length of a first embodiment of the connecting tube, as shown in FIG. 2.

FIG. 4A shows a graphical representation of this pressure gradient along the length of the feed tube 62 for the first embodiment of the invention (FIG. 2), as measured by the distance d between the crucible and the ionization chamber. The pressure profile drops along the feed tube linearly up to the mass flow controller 60, then is modified by the mass flow controller, then continues to drop linearly for the remainder of the distanced up to the ionization chamber 58. In the preferred embodiment, the distance d is approximately up to about 24 inches. Such a distance, however, is provided merely for exemplary purposes. The invention covers a sublimator/vaporizer remotely located from an ionization chamber, and is not limited to any particular distance representing this remote location.

Figure 4B:
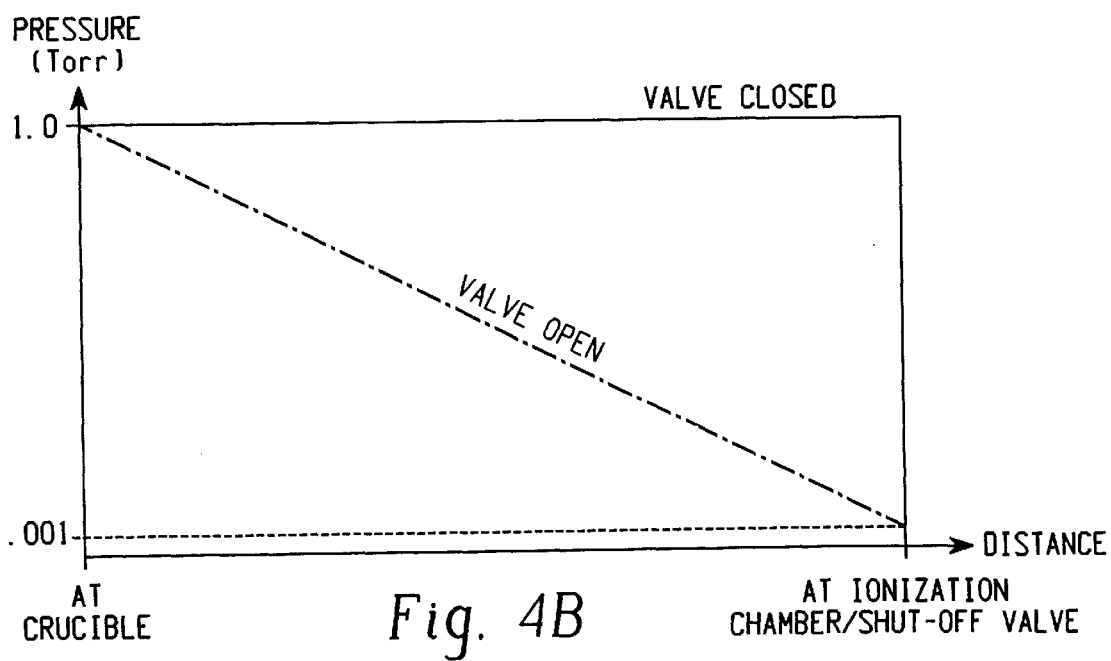
FIG. 4B is a graphical representation of the pressure gradient that exists along the length of a second embodiment of the connecting tube, as shown in FIG. 3.

FIG. 4B shows a graphical representation of this pressure gradient along the length of the feed tube 62 for the second embodiment of the invention (FIG. 3), as measured by the distance d between the crucible and the ionization chamber/shut-off valve interface. When the shut-off valve is open, the pressure profile drops along the feed tube linearly from the crucible up to the ionization chamber/shut-off valve interface. When the valve is closed, no pressure gradient exists. As explained above, in this second embodiment, no mass flow controller is used.

By locating the crucible 52 remotely from the ionization chamber 58, the temperature within crucible cavity 66 is thermally isolated, thereby providing a thermally stable environment unaffected by the temperature in the ionization chamber 58. As such, the temperature of the crucible cavity 66, in which the process of decaborane sublimation occurs, may be controlled independently of the operating temperature of the ionization chamber 58 to a high degree of accuracy (within 1° C.). Also, by maintaining a constant temperature of the vaporized decaborane during transport to the ionization chamber 58 via the heated feed tube 62, no condensation or thermal decomposition of the vapor occurs.

The temperature controller 56 controls the temperature of the crucible 52 and the feed tube 62 by controlling the operation of the heating element 80 for the heating medium reservoir 70. Thermocouple 92 senses the temperature of the reservoir 70 and sends temperature feedback signal 93 to the temperature controller 56. The temperature controller responds to this input feedback signal in a known manner by outputting control signal 94 to the reservoir heating element 80. In this manner, a uniform temperature is provided for all surfaces to which the solid phase decaborane and vaporized decaborane are exposed, up to the location of the ionization chamber.

By controlling the circulation of the heating medium in the system (via pump 55) and the temperature of the heating medium (via heating element 80), the ion source 50 can be controlled to an operating temperature of on the order of 20° C. to 150° C. (+/−1° C.). Precise temperature control is more critical at the crucible, as compared to the end of the feed tube nearest the ionization chamber, to control the pressure of the crucible and thus the vapor flow rates out of the crucible.

Using either embodiment of the source 50 of FIG. 2 in an ion implanter, an entire molecule (ten boron atoms) is implanted into the workpiece. The molecule breaks up at the workpiece surface such that the energy of each boron atom is roughly one-tenth the energy of the ten-boron cluster (in the case of $B_{10}H_{14}$). Thus, the beam can be transported at ten times the desired boron implantation energy, enabling very shallow implants without significant beam transmission losses. In addition, at a given beam current, each unit of current delivers ten times the dose to the workpiece. Finally, because the charge per unit dose is one-tenth that of a monatomic beam implant, workpiece charging problems are much less severe for a given dose rate.

Accordingly, a preferred embodiment of an improved ion source for an ion implanter has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. An ion source (50) for an ion implanter, comprising:
   (i) a sublimator (52) having a cavity (66) for receiving a source material (68) to be sublimated and for sublimating the source material, wherein said source material is a molecular solid having a vapor pressure of between $10^{-2}$ Torr and $10^3$ Torr and a sublimation temperature of between 20° C. and 150° C.;
   (ii) an ionization chamber (58) for ionizing the sublimated source material, said ionization chamber located remotely from said sublimator;
   (iii) a feed tube (62) for connecting said sublimator (52) to said ionization chamber (58);
   (iv) a heating medium (70) for heating at least a portion of said sublimator (52) and said feed tube (62); and
   (v) a control mechanism for controlling the temperature of said heating medium (70).

2. The ion source (50) of claim 1, wherein said control mechanism comprises a heating element (80) for heating the heating medium (70), a pump (55) for circulating said heating medium, at least one thermocouple (92) for providing temperature feedback from said heating medium (70), and a controller (56) responsive to said temperature feedback to output a first control signal (94) to said heating element.

3. The ion source (50) of claim 1, wherein said heating medium (70) is water.

4. The ion source (50) of claim 1, wherein said heating medium (70) is mineral oil.

5. The ion source (50) of claim 1, wherein said feed tube (62) is comprised of quartz.

6. The ion source (50) of claim 1, wherein said feed tube (62) is comprised of stainless steel.

7. The ion source (50) of claim 1, wherein said ionization chamber (58) includes an inlet (72) for receiving gas from a compressed gas source.

8. The ion source (50) of claim 1, wherein said feed tube (62) is surrounded by a sheath (90) through which said heating medium (70) is circulated.

9. The ion source (50) of claim 1, wherein said sheath (90) comprises an inner sheath (90A) surrounded by an outer sheath (90B).

10. An ion source (50) for an ion implanter, comprising:
   (i) a sublimator (52) having a cavity (66) for receiving a source material (68) to be sublimated and for sublimating the source material, wherein said source material is decaborane;
   (ii) an ionization chamber (58) for ionizing the sublimated source material, said ionization chamber located remotely from said sublimator;
   (iii) a feed tube (62) for connecting said sublimator (52) to said ionization chamber (58);
   (iv) a heating medium (70) for heating at least a portion of said sublimator (52) and said feed tube (62); and
   (v) a control mechanism for controlling the temperature of said heating medium (70).

11. A vaporizer for an ion source (50), comprising:
   (i) a sublimator (52) having a cavity (66) for receiving a source material (68) to be vaporized and for vaporizing the source material, wherein said source material is a molecular solid having a vapor pressure of between $10^{-2}$ Torr and $10^3$ Torr and a sublimation temperature of between 20° C. and 150° C.;
   (ii) a feed tube (62) for connecting said sublimator (52) to a remotely located ionization chamber in which vaporized source material may be ionized;
   (iii) a heating medium (70) for heating at least a portion of said sublimator (52) and said feed tube (62); and
   (iv) a control mechanism for controlling the temperature of said heating medium (70).

12. The vaporizer for an ion source (50) of claim 11, wherein said control mechanism comprises a heating element (80) for heating the heating medium (70), a pump (55) for circulating said heating medium, at least one thermocouple (92) for providing temperature feedback from said heating medium (70), and a controller (56) responsive to said temperature feedback to output a first control signal (94) to said heating element.

13. The vaporizer for an ion source (50) of claim 11, wherein said heating medium (70) is water.

14. The vaporizer for an ion source (50) of claim 11, wherein said heating medium (70) is mineral oil.

15. The vaporizer for an ion source (50) of claim 11, wherein said feed tube (62) is comprised of stainless steel.

16. The vaporizer for an ion source (50) of claim 11, wherein said feed tube (62) is comprised of quartz.

17. The vaporizer for an ion source (50) of claim 11, wherein said feed tube (62) is surrounded by a sheath (90) through which said heating medium (70) is circulated.

18. The vaporizer for an ion source (50) of claim 17, wherein said sheath (90) comprises an inner sheath (90A) surrounded by an outer sheath (90B).

19. A vaporizer for an ion source (50), comprising:
   (i) a sublimator (52) having a cavity (66) for receiving a source material (68) to be vaporized and for vaporizing the source material, wherein said source material is decaborane;
   (ii) a feed tube (62) for connecting said sublimator (52) to a remotely located ionization chamber in which vaporized source material may be ionized;
   (iii) a heating medium (70) for heating at least a portion of said sublimator (52) and said feed tube (62); and
   (iv) a control mechanism for controlling the temperature of said heating medium (70).

* * * * *